(12) United States Patent
Sejima

(10) Patent No.: US 9,983,270 B2
(45) Date of Patent: May 29, 2018

(54) STATE OF CHARGE ESTIMATION DEVICE AND METHOD OF ESTIMATING STATE OF CHARGE

(71) Applicant: GS Yuasa International Ltd., Kyoto-shi (JP)

(72) Inventor: Kenichi Sejima, Kyoto (JP)

(73) Assignee: GS YUASA INTERNATIONAL LTD., Kyoto-shi, Kyoto (JP)

( * ) Notice: Subject to any disclaimer, the term of this patent is extended or adjusted under 35 U.S.C. 154(b) by 964 days.

(21) Appl. No.: 14/242,341

(22) Filed: Apr. 1, 2014

(65) Prior Publication Data
US 2014/0303914 A1    Oct. 9, 2014

(30) Foreign Application Priority Data

Apr. 3, 2013   (JP) .................................. 2013-077474

(51) Int. Cl.
*G01R 31/36*   (2006.01)

(52) U.S. Cl.
CPC ..... *G01R 31/3682* (2013.01); *G01R 31/3624* (2013.01); *G01R 31/361* (2013.01); *G01R 31/3651* (2013.01); *G01R 31/3658* (2013.01)

(58) Field of Classification Search
CPC .................................................. G01R 31/3682
See application file for complete search history.

(56) References Cited

U.S. PATENT DOCUMENTS

| 7,443,139 | B2 | 10/2008 | Mitsui et al. |
| 7,679,329 | B2 | 3/2010 | Lim et al. |
| 7,982,433 | B2 | 7/2011 | Lim et al. |
| 8,093,902 | B2 | 1/2012 | Nishi et al. |
| 8,274,291 | B2 | 9/2012 | Tsuchiya |

(Continued)

FOREIGN PATENT DOCUMENTS

| CN | 1668933 A | 9/2005 |
| CN | 1988242 A | 6/2007 |

(Continued)

OTHER PUBLICATIONS

European Search Report dated Aug. 4, 2014.

*Primary Examiner* — John Breene
*Assistant Examiner* — Jeffrey C Morgan
(74) *Attorney, Agent, or Firm* — McGinn IP Law Group, PLLC.

(57) ABSTRACT

The state of charge (SOC) estimation device includes a memory and a controller component. The memory stores data on a first correlation between an elapsed time and an estimation error in SOC estimation. The controller component executes a first estimation process and a second estimation process. The first estimation process is for estimating a first SOC and a first estimation error of the electric storage device in a non-charge/discharge state based on a terminal voltage and the elapsed time. The second estimation process is for estimating a second SOC and a second estimation error of the electric storage device in a charge/discharge state based on an accumulated charge/discharge current. The controller component calculates a total error from the first estimation error and the second estimation error. The controller component estimates the first estimation error when the elapsed time becomes equal to or longer than a reference time.

15 Claims, 12 Drawing Sheets

(56) References Cited

U.S. PATENT DOCUMENTS

| | | | |
|---|---|---|---|
| 8,664,960 B2 | 3/2014 | Tsuchiya | |
| 2005/0269991 A1 | 12/2005 | Mitsui et al. | |
| 2007/0145948 A1 | 6/2007 | Lim et al. | |
| 2007/0148532 A1 | 6/2007 | Lim et al. | |
| 2009/0001992 A1 | 1/2009 | Tsuchiya | |
| 2010/0085057 A1 | 4/2010 | Nishi et al. | |
| 2011/0213576 A1 | 9/2011 | Motz et al. | |
| 2011/0257914 A1 | 10/2011 | Tsuchiya | |
| 2011/0311850 A1 | 12/2011 | Ashida | |
| 2012/0290237 A1 | 11/2012 | Takahashi et al. | |
| 2013/0013237 A1* | 1/2013 | Sato | G01R 31/362 702/63 |
| 2013/0090871 A1* | 4/2013 | Akabori | G06F 17/00 702/63 |
| 2013/0297243 A1 | 11/2013 | Baba et al. | |

FOREIGN PATENT DOCUMENTS

| | | |
|---|---|---|
| CN | 101005209 A | 7/2007 |
| CN | 101346636 A | 1/2009 |
| CN | 101641607 A | 2/2010 |
| DE | 10 2008-041546 A1 | 3/2010 |
| EP | 1972955 A1 | 9/2008 |
| JP | 2000-295775 A | 10/2000 |
| JP | 2011-106952 A | 6/2011 |
| JP | 2011-169831 A | 9/2011 |
| JP | 2011-209237 A | 10/2011 |
| JP | 2011-257207 A | 12/2011 |
| JP | 2012-2660 A | 1/2012 |
| JP | 2012-057998 A | 3/2012 |
| JP | 2012-088157 A | 5/2012 |
| JP | 2012-093363 A | 5/2012 |
| JP | 4984527 B2 | 7/2012 |
| JP | 2012-149947 A | 8/2012 |
| JP | 2012-149948 A | 8/2012 |

* cited by examiner

FIG.8

| ERROR ΔC | ELAPSED TIME T | TIME VARIATION DV |
|---|---|---|
| ± 2 % ≤, > ± 3 % | T3 (>T2) | DV3 (<DV2) |
| ± 3 % ≤, > ± 4 % | T2 (>T1) | DV2 (<DV1) |
| ± 4 % ≤ | T1 | DV1 |

STATE OF CHARGE ESTIMATION DEVICE AND METHOD OF ESTIMATING STATE OF CHARGE

CROSS-REFERENCE TO RELATED APPLICATIONS

This application claims priority from Japanese Patent Application No. 2013-077474 filed on Apr. 3, 2013. The entire content of this priority application is incorporated herein by reference.

FIELD

Technologies described herein relates to a technology for estimating a state of charge of an electric storage device.

BACKGROUND

Conventionally, technologies for estimating states of charge (SOCs) of electric storage devices have been known (e.g., JP-A-2012-149947). Examples of such technologies include a technology for estimating SOCs of electric storage devices by a combination of an open circuit voltage (OCV) method and a current accumulation method. The OCV method is a method for estimating open circuit voltages while an electric storage device is in a non-charge/discharge state and estimating SOC of the electric storage device based on the estimated open circuit voltages. The current accumulation method is a method for estimating SOCs of electric storage devices based on accumulated currents of charge/discharge currents during charge/discharge of the electric storage devices.

In estimation by the OCV method, an error in SOC estimation increases as elapsed time since charge/discharge is stopped is shorter. In estimation by the current accumulation method, an error in SOC estimation increases as an accumulated current becomes larger. Conventionally, different reference errors are set for estimation by the OCV method and estimation by the current accumulation method so that a total error calculated from an error in the estimation by the OCV method and an error in the estimation by the current accumulation method does not exceed a predefined reference error. For the estimation by the OCV method, a constant reference time is set based on the reference error. An OCV is estimated based on a terminal voltage of an electric storage device measured when time since charge/discharge of the electric storage device is stopped passed a reference time, and the SOC of the electric storage device is estimated based on the estimated OCV.

However, the conventional technology for estimating the SOC using the reference time that is set at constant may cause various problems. For example, if a relatively long period is set for the reference time, the number of times of SOC estimation during charge/discharge decreases, that is, a period in which the SOC estimation is not performed is prolonged. As a result, an error in SOC estimation becomes larger. If a relatively short period is set for the reference time, the number of times of SOC estimation increases. However, with this configuration, an error in SOC estimation is large. Therefore, there have been demands for technologies for properly setting the reference time and estimating SOCs of electric storage devices more accurately than the conventional SOC estimation.

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

This specification describes a technology for estimating a state of charge of an electronic storage device. The state of charge estimation device includes a memory and a controller component. The memory stores data on a first correlation between an elapsed time since an end of charge/discharge of the electric storage device and an estimation error in estimation of the state of charge. The controller component is configured to execute a first estimation process and a second estimation process. The first estimation process is for estimating a first state of charge and a first estimation error of the electric storage device in a non-charge/discharge state based on a terminal voltage of the electric storage device in the non-charge/discharge state and the elapsed time. The second estimation process is for estimating a second state of charge and a second estimation error of the electric storage device in a charge/discharge state based on an accumulated charge/discharge current of the electric storage device in the charge/discharge state. The controller component is configured to calculate a total error from the first estimation error and the second estimation error in the first estimation process. The controller component is configured to estimate the first estimation error when the elapsed time becomes equal to or longer than a reference time defined based on the total error and the first correlation.

BRIEF DESCRIPTION OF DRAWINGS

The foregoing and other features of the present invention will become apparent from the following description and drawings of an illustrative embodiment of the invention in which:

FIG. 8 is a table illustrating a relationship of error, elapsed time, and time variation;

DESCRIPTION OF EMBODIMENTS

Figure 1:
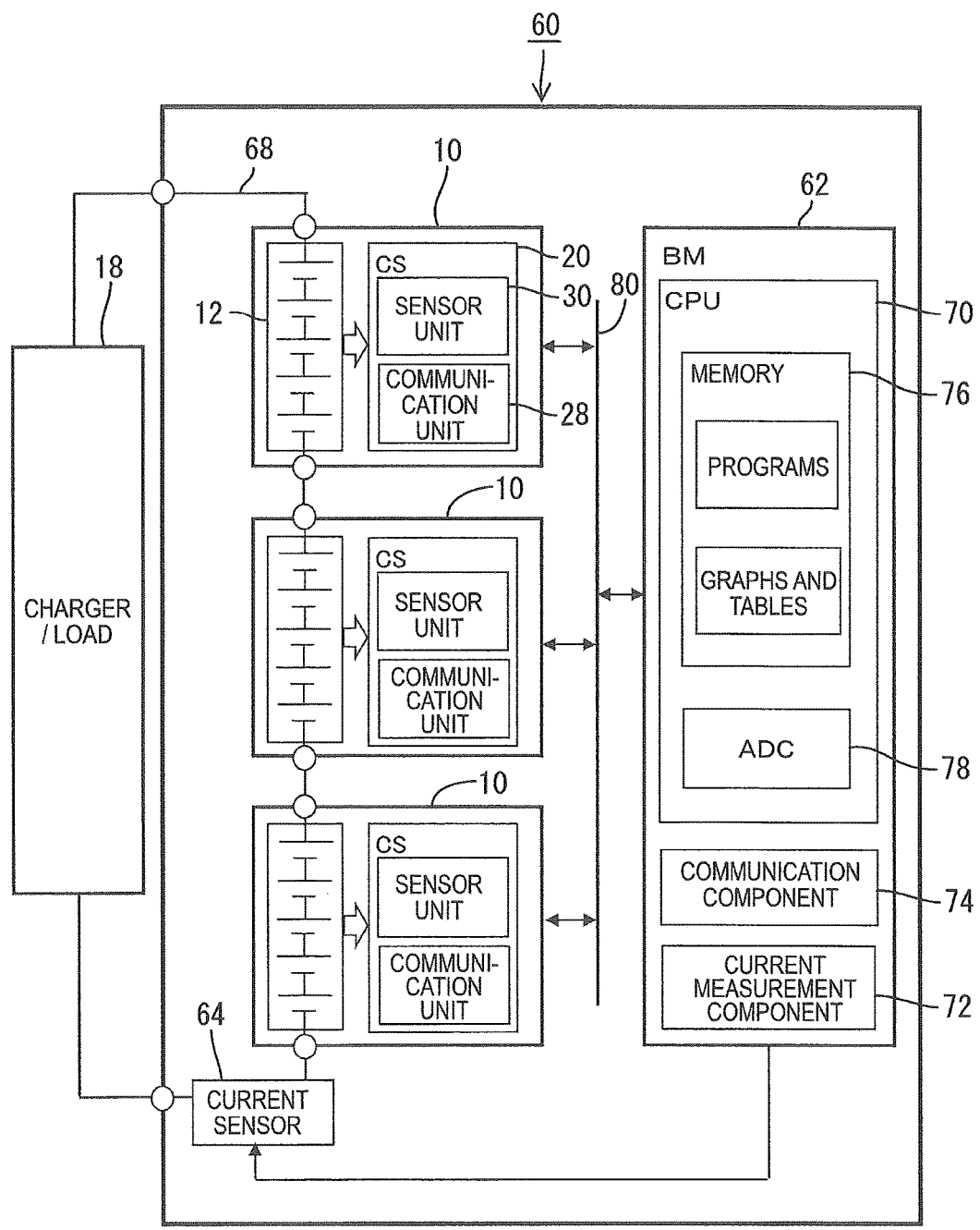
FIG. 1 is a schematic view illustrating a configuration of a battery pack.

According to technologies described herein, a state of charge of an electric storage device can be more accurately estimated in comparison to a conventional technology in which a specific reference time is set.

According to a first aspect, the state of charge estimation device includes a memory and a controller component. The memory stores data on a first correlation between an elapsed time since an end of charge/discharge of the electric storage device and an estimation error in estimation of the state of charge. The controller component is configured to execute a first estimation process and a second estimation process. The first estimation process is for estimating a first state of charge and a first estimation error of the electric storage device in a non-charge/discharge state based on a terminal voltage of the electric storage device in the non-charge/discharge state and the elapsed time. The second estimation process is for estimating a second state of charge and a second estimation error of the electric storage device in a charge/discharge state based on an accumulated charge/discharge current of the electric storage device in the charge/discharge state. The controller component is configured to calculate a total error from the first estimation error and the second estimation error in the first estimation process. The controller component is configured to estimate the first estimation error when the elapsed time becomes equal to or longer than a reference time defined based on the total error and the first correlation.

In the state of charge estimation device, the reference time is defined based on the total error indicating an error in the state of charge estimation of the electric storage device at an end of the charge/discharge, and the first estimation error is estimated. When the elapsed time becomes equal to or longer then the reference time, the first estimation error is equal to or smaller than the total error. Therefore, the first state of charge can be more accurately estimated in comparison to the state of charge of the electric storage device at the end of the charge/discharge.

According to a second aspect, the controller component is further configured to: update the reference time to a time longer than the present reference time when the elapsed time becomes equal to or longer than the present reference time in the first estimation process; estimate the first estimation error when the elapsed time becomes equal to or longer than the updated reference time in the first estimation process; and update the first estimation error with the newly estimated first estimation error.

In the state of charge estimation device, when the elapsed time becomes equal to or longer than the present reference time, the present reference time is updated to a time longer than the present reference time. When the elapsed time becomes equal to or longer than the updated reference time, the first estimation error is estimated and the first estimation error is updated with newly estimated first estimation error. By updating the first state of charge, the first state of charge can be more accurately estimated in comparison to the first state of charge estimated based on the total error.

According to a third aspect, the controller component is further configured to repeatedly execute the update of the reference time and the estimation of the first estimation error in the first estimation process.

According to the state of charge estimation device, the update of the reference time and the estimation of the first state of charge are repeated while the non-charge/discharge state is maintained. Therefore, accuracy in estimation of the first state of charge can be continuously improved.

According to a fourth aspect, the controller component is further configured to calculate the total error by adding the first estimation error and the second estimation error.

According to the state of charge estimation device, the total error is calculated by adding the first estimation error and the second estimation error. In comparison to a square root of a sum of squares of the first estimation error and the second estimation error is calculated as a total error, for example, fewer steps are required for calculating the total error and thus the total error can be easily calculated.

According to a fifth aspect, the memory further stores data on a second correlation between estimation error in the estimation of state of charge and time variation in the terminal voltage. The controller component is further configured to: estimate a time variation in the terminal voltage based on the terminal voltage and the elapsed time; estimate that the elapsed time becomes equal to or longer than the reference time when the estimated time variation in the terminal voltage becomes equal to or smaller than a tolerance defined based on the total error and the second correlation; update the tolerance to a smaller value when the time variation in the terminal voltage becomes equal to or smaller than the tolerance; estimate the first estimation error when the time variation in the terminal voltage reaches the updated tolerance; and update the first estimation error with the newly estimated first estimation error.

In the state of charge estimation device, the tolerance is defined based on the total error indicating an error in the state of charge of the electric storage device at an end of the charge/discharge, and the first estimation error is estimated. When the time variation in the terminal voltage becomes equal to or smaller than the tolerance, the tolerance is updated to the smaller value. When the time variation in the terminal voltage becomes equal to or smaller than the updated tolerance, the first state of charge is estimated again and updated. By updating the first state of charge, the first state of charge can be more accurately estimated in comparison to the first state of charge estimated based on the total error.

According to a sixth aspect, a method of estimating a state of charge of an electric storage device includes a first estimation process and a second estimation process. The first estimation process is for estimating a first state of charge and a first estimation error of the electric storage device in a non-charge/discharge state based on a terminal voltage of the electric storage device in the non-charge/discharge state and an elapsed time. The second estimation process is for estimating a second state of charge and a second estimation error of the electric storage device in a charge/discharge state based on an accumulated charge/discharge current of the electric storage device in the charge/discharge state. The first estimation process includes: calculating a total error from the first estimation error and the second estimation error; and estimating the first estimation error when the elapsed time becomes equal to or longer than a reference time defined based on the total error and a first correlation.

In the first estimation process according to the method, the first estimation error is estimated based on the total error indicating an error in the state of charge of the electric storage device at the end of the charge/discharge. In comparison to the state of charge at the end of the charge/discharge, the first state of charge can be more accurately estimated.

An embodiment will be described with reference to FIGS. 1 to 8.

1. Configuration of State of Charge Estimation Device

FIG. 1 illustrates a configuration of a battery pack 60 according to this embodiment. The battery pack 60 will be installed in an electric vehicle or a hybrid vehicle and supply power to an electrically-powered device that operates with electrical energy.

As illustrated in FIG. 1, the battery pack 60 includes battery modules 10, a battery manager (BM) 62, and a current sensor 64. Each battery module 10 includes an assembled battery 12 and a cell sensor (CS) 20. The assembled battery 12 includes cells 14 (see FIG. 2). The CS 20 is a circuit board including a sensor unit 30 and a communication unit 28. The BM 62 is configured to manage the battery modules 10. The BM 62 and CS 20 are an example of a state of charge estimation device. The cell 14 is an example of an electric storage device.

The assembled batteries 12 and the current sensor 64 are connected in series via an electric line 68. The assembled batteries 12 and the current sensor 64 are connected to a charger of a charger/load 18 arranged outside the electric vehicle or a load of the charger/load 18 arranged inside the electric vehicle.

The BM 62 includes a central processing unit (CPU) 70, a current measurement component 72, and a communication component 74. The current measurement component 72 measures a current I (A) of a charge current or a discharge current (hereinafter referred to as a charge/discharge current) of the assembled batteries 12 at predetermined intervals using the current sensor 64. The CPU 70 is an example of a controller component.

As illustrated in FIG. 1, the CPU 70 includes a memory 76, such as ROM and RAM, and an analog-to-digital converter (ADC) 78. The memory 76 stores various programs for controlling operation of the CS 20 (including a battery management program). The ADC 78 converts the current I, which is measured as an analog signal, to a digital value. The CPU 70 performs control processes for components of the battery pack 60 according to programs read out of the memory 76. For example, the CPU 70 executes an SOC estimation process, which will be described later. The memory 76 is an example of a memory.

The memory 76 stores a first graph (see FIG. 5), a second graph (see FIG. 7), and a correspondence table (see FIG. 8), which will be described later, regarding the cell 14. The first graph represents a correlation between absolute accumulated value IZ and an error ΔC in SOC (%) of the cell 14. The absolute accumulated value IZ is an absolute value of the accumulated current calculated by accumulating absolute values of currents of the assembled battery 12 that is in a charge/discharge state. The correlation between the absolute accumulated value IZ and the error ΔC is expressed by a line that crosses the origin. The SOC represents a state of charge of the electric storage device. The SOC of the fully-charged electric storage device is 100% and that of the fully-discharged electric storage device is 0%. The error ΔC is a value defined based on a measurement error of the current sensor 64.

The second graph expresses a correlation between SOC of the cell 14 and an open circuit voltage (OCV). The correspondence table represents a correlation between elapsed time T (sec) since an end of charge/discharge of the cell 14 and error ΔC. The correspondence table is an example of data on a first correlation.

The communication component 74 is connected to the CSs 20 in the battery modules 10 via a communication line 80. The communication component 74 is configured to receive information including voltages V and temperatures D measured by the CSs 20, which will be described later.

The CPU 70 controls charge/discharge of the assembled batteries 12 using the information and estimates SOCs of the cells 14.

The battery pack 60 includes an operation component for receiving inputs from a user (not illustrated) and a display component (not illustrated) including a liquid crystal display for displaying degradation levels of the assembled batteries 12 and other information.

Figure 2:
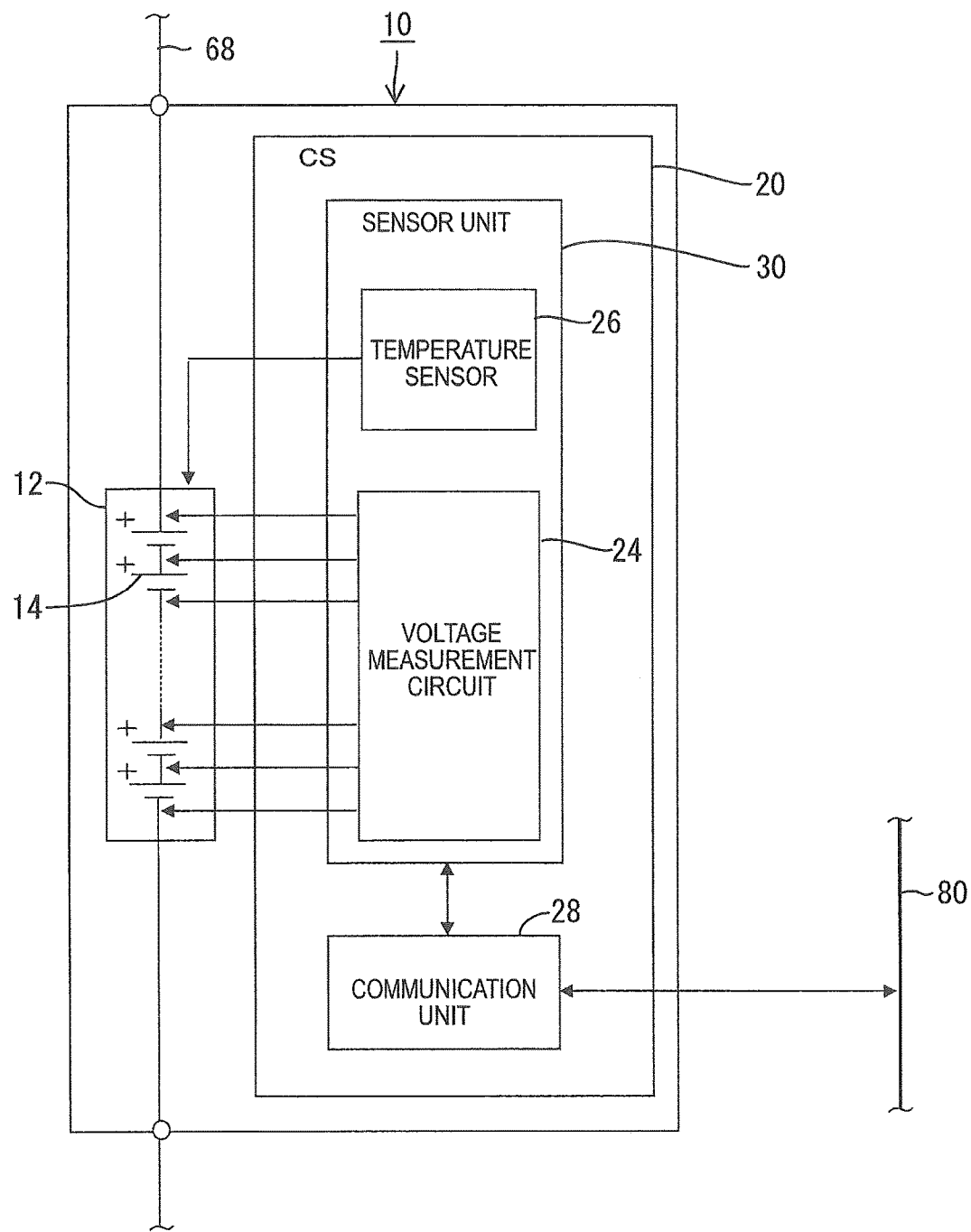
FIG. 2 is a schematic view illustrating a configuration of a battery module.
Figure 3:
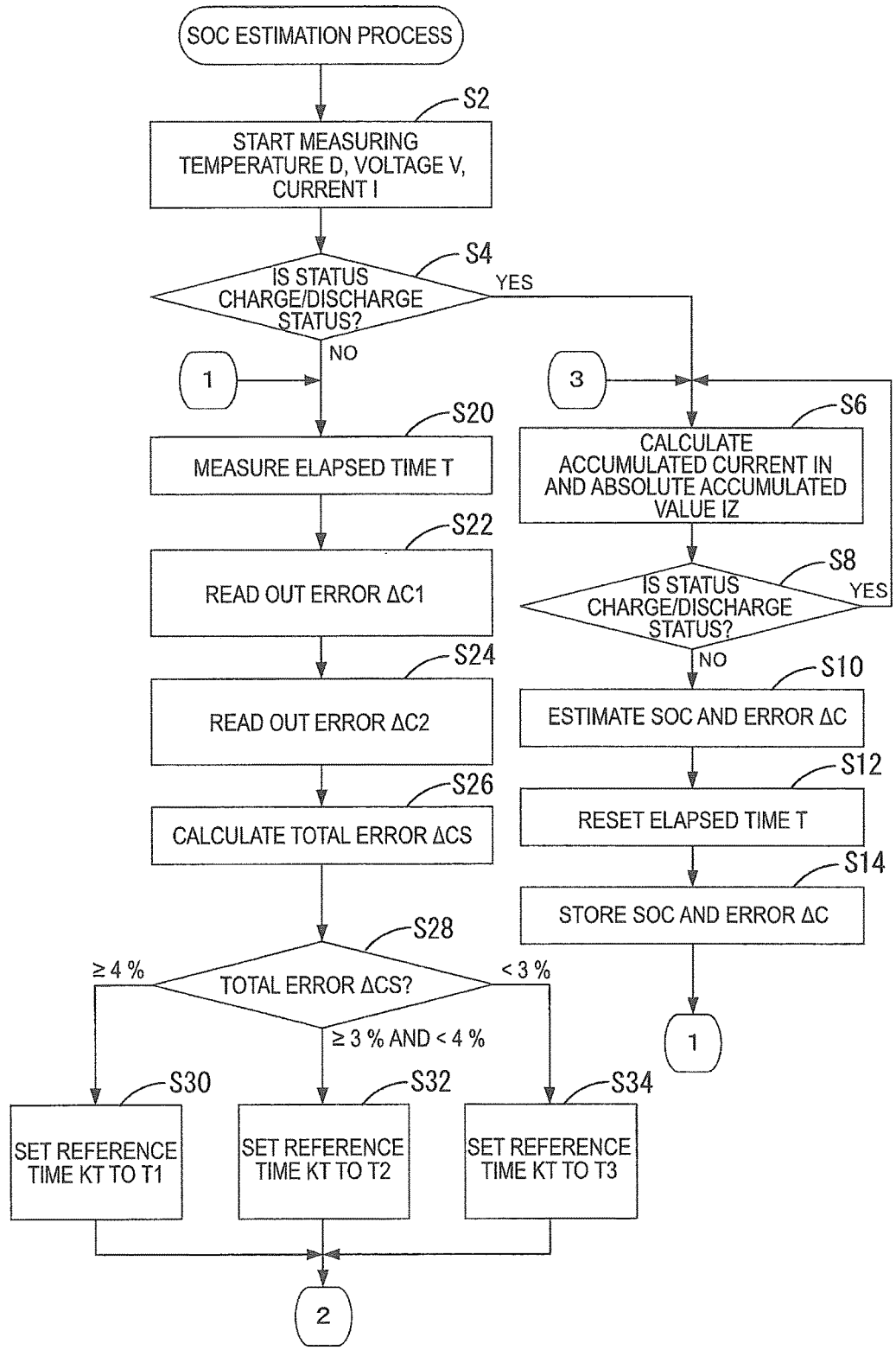
FIG. 3 is a part of a flowchart illustrating an SOC estimation process according to an embodiment.
Figure 4:
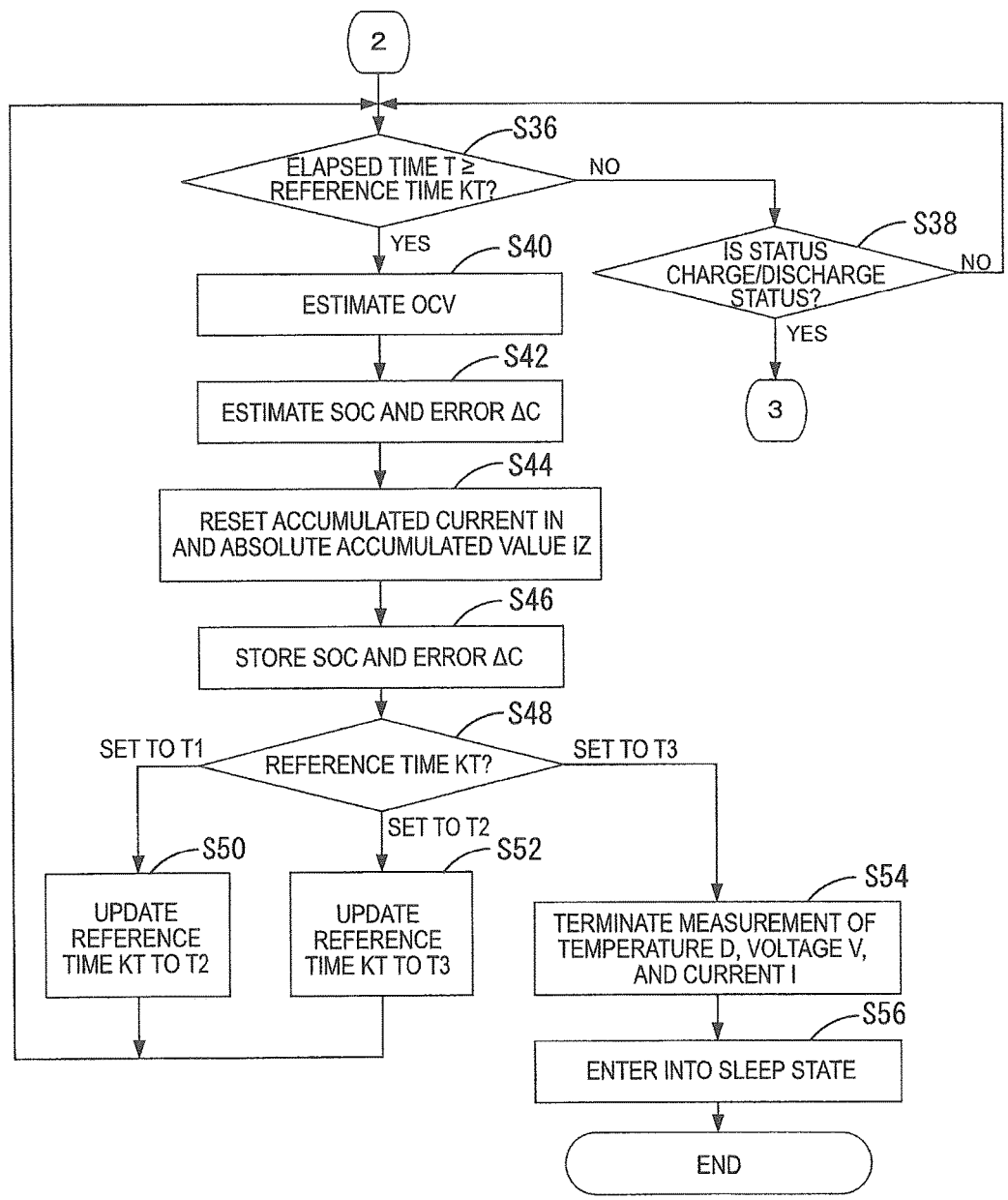
FIG. 4 is a part of the flowchart illustrating the SOC estimation process according to the embodiment.
Figure 5:
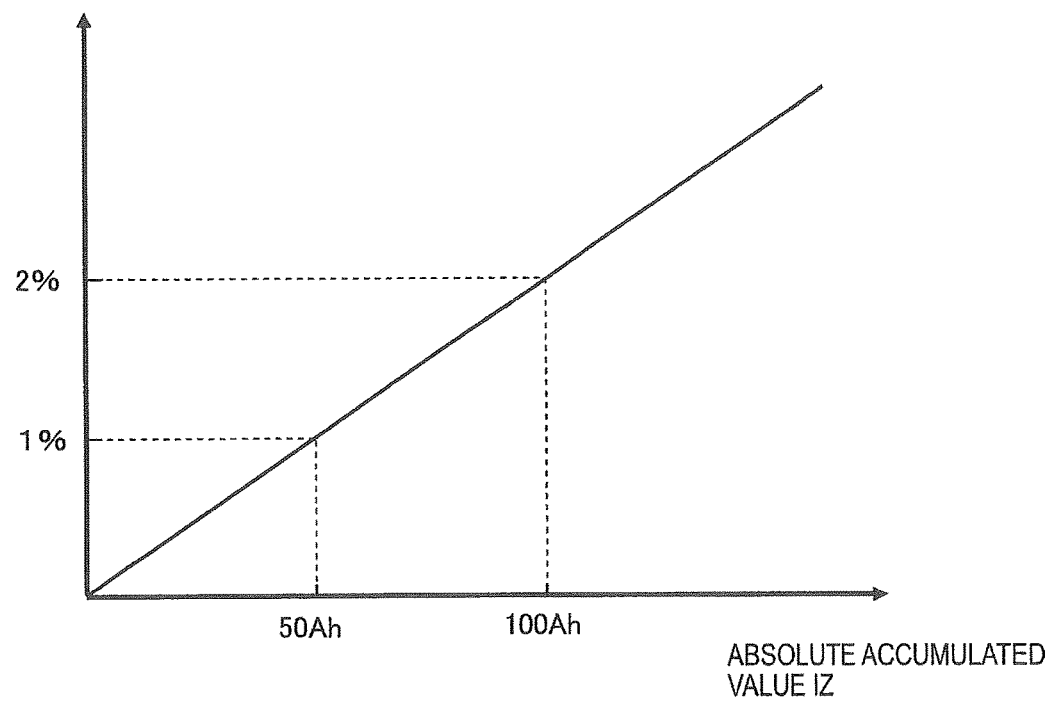
FIG. 5 is a graph illustrating a relationship between absolute integrated value and error.

A schematic configuration of each battery module 10 is illustrated in FIG. 2. Each assembled battery 12 has a configuration in which multiple cells 14 are connected in series. Each cell 14 is a secondary battery that can be rechargeable. Specifically, the cell 14 is a lithium ion battery, a terminal voltage of which is about 4 V in the fully-charged state. More specifically, the cell 14 is a lithium ion battery including more than two kinds of lithium-contained metal oxide as a positive electrode active material. Examples of the lithium-contained metal oxide include metal oxide containing one or more kinds of elements Co, Mn and Ni. A crystal structure of the positive electrode active material is a mixture of a lithium-contained metal oxide having a spinel structure and a lithium-contained metal oxide having a layer structure.

Each CS 20 includes the sensor unit 30 and the communication unit 28. The sensor unit 30 includes a voltage measurement circuit 24 and a temperature sensor 26. The voltage measurement circuit 24 is connected across each cell 14 in the assembled battery 12. The voltage measurement circuit 24 is configured to measure voltages V (V) across the cell 14 at predetermined intervals. The temperature sensor 26 is a contact or non-contact type temperature sensor. The temperature sensor 26 is configured to measure temperatures D (° C.) of each cell 14 in the assembled battery 12 at predetermined intervals. The voltage V across the cell 14 is an example of a terminal voltage.

The communication unit 28 is connected to the BM 62 via the communication line 80. The communication unit 28 is configured to transmit information including the voltages V and the temperatures D measured by the CSs 20 to the BM 62. The BM 62 stores the voltages V and the temperatures D transmitted from the CSs 20 in the memory 76.

2. SOC Estimation Process

Next, an SOC estimation process for estimating an SOC of each cell 14 will be described with reference to FIGS. 3 to 8. In the SOC estimation process, a voltage V across the cell 14 that is in a non-charge/discharge state is measured and the estimation of the SOC of the cell 14 and the error ΔC is executed by the OCV method. In the OCV method, an OCV of the cell 14 and the error ΔC are estimated based on the measured voltage V. While the cell 14 is in the charge/discharge state, a charge/discharge current I of the assembled battery 12 is measured and the estimation of the SOC of the cell 14 and the error ΔC is executed by the current accumulation method. In the current accumulation method, the SOC of the cell 14 and the error ΔC are estimated based on the measured charge/discharge current I.

When the cell 14 is in use, the cell 14 alternately enters the charge/discharge state and the non-charge/discharge state. Therefore, in the SOC estimation process, the estimation of the SOC by the current accumulation method and the estimation of the SOC by the OCV method are alternately executed. The following example describes the estimation of the SOC of the cell 14 that is in the non-charge/discharge state (or in a sleep state) after having been in the charge/discharge state once or more times and in the non-charge/discharge state once or more times.

In this example, the memory 76 stores the SOCs of the cell 14 and the errors ΔC estimated by the current accumulation method and the OCV method more than once. In the following description, the SOC of the cell 14 and the error ΔC at the start of the SOC estimation process are referred to as SOC1 and error ΔC1, respectively. The SOC1 and the error ΔC1 are estimated by the OCV method, which will be described later, and stored in the memory 76. The SOC1 is an example of a first state of charge and the error ΔC1 is an example of a first estimation error.

The SOC estimation process may be executed for every cell 14 or the specific cell 14. In this example, the SOC estimation is executed only for the cell 14 that is degraded the earliest among the cells 14, that is, the measured voltage V is the lowest.

In the battery pack 60, when the electric vehicle is powered on or charge of the electric vehicle is started, that is, the battery pack 60 is turned on by a user, the BM 62 and the CSs 20 are activated and the charge/discharge of the assembled batteries 12 starts. When the BM 62 is activated, the CPU 70 reads the program out of the memory 76 and starts the SOC estimation process. The CPU 70 starts measuring the temperature D and the voltage V of the cell 14 and the current I of the assembled battery 12 at the beginning of the SOC estimation process (S2).

Then, the CPU 70 determines whether a status of the cell 14 is a charge/discharge status that indicates that the cell 14 is in the charge/discharge state (S4). Namely, the CPU 70 determines whether the cell 14 is in the charge/discharge state using the current I. For example, if the current I is zero because the electric vehicle is stopped or the charge of the electric vehicle is stopped, the CPU 70 determines that the cell 14 is in the non-charge/discharge state (NO in step S4). A condition that "the current I is zero" is not limited to a condition that the current I is completely zero. The condition may be a condition that the current I is about zero, that is, equal to or smaller than a predetermined current at completion of charge/discharge.

If the current I is not zero, the CPU 70 determines that the cell 14 is in the charge/discharge state (YES in step S4). After the electric vehicle is powered on or the charge of the electric vehicle is started, the cell 14 enters the charge/discharge state in which the charge/discharge current of the cell 14 is not zero. In this situation, the CPU 70 executes the SOC estimation by the current accumulation method illustrated by steps S6 through S14.

Current Accumulation Method

When the cell 14 is in the charge/discharge state, the CPU 70 calculates an accumulated current IN by adding up the currents I measured since the charge/discharge state of the cell 14 is determined and an absolute accumulated value IZ by adding up the absolute values of the currents I (S6). The CPU 70 determines whether the status of the cell 14 is the charge/discharge status (S8) again. If the charge/discharge state of the cell 14 is maintained (YES in step S8), the CPU 70 returns to step S6.

When the current I becomes zero and the state of the cell 14 shifts from the charge/discharge state to the non-charge/discharge state (NO in step S8), the CPU 70 estimates the SOC and the error ΔC based on the calculated accumulated current IN and the calculated absolute accumulated value IZ (S10). The CPU 70 calculates a capacity variation rate ΔSOC based on the accumulated current IN and a battery capacity. The accumulated current IN here is a current accumulated until immediately before the cell 14 enters the non-charge/discharge state. The battery capacity corresponds to the accumulated current IN of the current I drawn during the discharge of the cell 14 from the fully-charged state to the fully-discharged state. The CPU 70 calculates the capacity by dividing the accumulated current IN by the battery capacity. The CPU 70 reads the SOC1 out of the memory 76 and estimates an SOC2 by adding the capacity variation rate ΔSOC to the SOC1. The SOC2 is an SOC when the cell 14 is in the charge/discharge state and an example of a second state of charge.

The CPU 70 selects an error ΔC corresponding to the absolute accumulated value IZ at the time immediately before the cell 14 enters the non-charge/discharge state from the first graph stored in the memory 76. The CPU 70 estimates the selected error ΔC as an error ΔC2 at the time when the cell 14 is in the charge/discharge state. When the estimation of the SOC2 and the error ΔC2 is complete, the CPU 70 resets the elapsed time T (S12) and stores the estimated SOC2 and the estimated error ΔC2 in the memory 76 (S14). The error ΔC2 is an example of a second estimation error.

The CPU 70 determines whether the status of the cell 14 is a charge/discharge status (S4). If the cell 14 is in the non-non-charge/discharge state (NO in step S4), the CPU 70 executes the estimation by the OCV method (steps S20 to S56).

Estimation by OCV Method

When the cell 14 is in the non-charge/discharge state, the CPU 70 measures the elapsed time T since the non-charge/discharge state of the cell 14 is detected (S20) and measures the voltage V in association with the elapsed time T at predetermined intervals. The CPU 70 reads the error ΔC1 (S22) and the error ΔC2 out of the memory 76 (S24). The error ΔC1 is estimated by the OCV method and stored in the memory 76. Therefore, the error ΔC1 is considered to be the previous error ΔC estimated by the OCV method. The error ΔC2 is considered to be the previous error ΔC estimated by the current accumulation method.

The CPU 70 calculates a total error ΔCS by adding the errors ΔC1 and ΔC2 (S26). The CPU 70 selects the elapsed time T corresponding to the calculated total error ΔCS from the correspondence table stored in the memory 76 and sets the selected elapsed time T as a reference time KT (S28).

$$\Delta CS = \Delta C1 + \Delta C2$$

Figure 6:
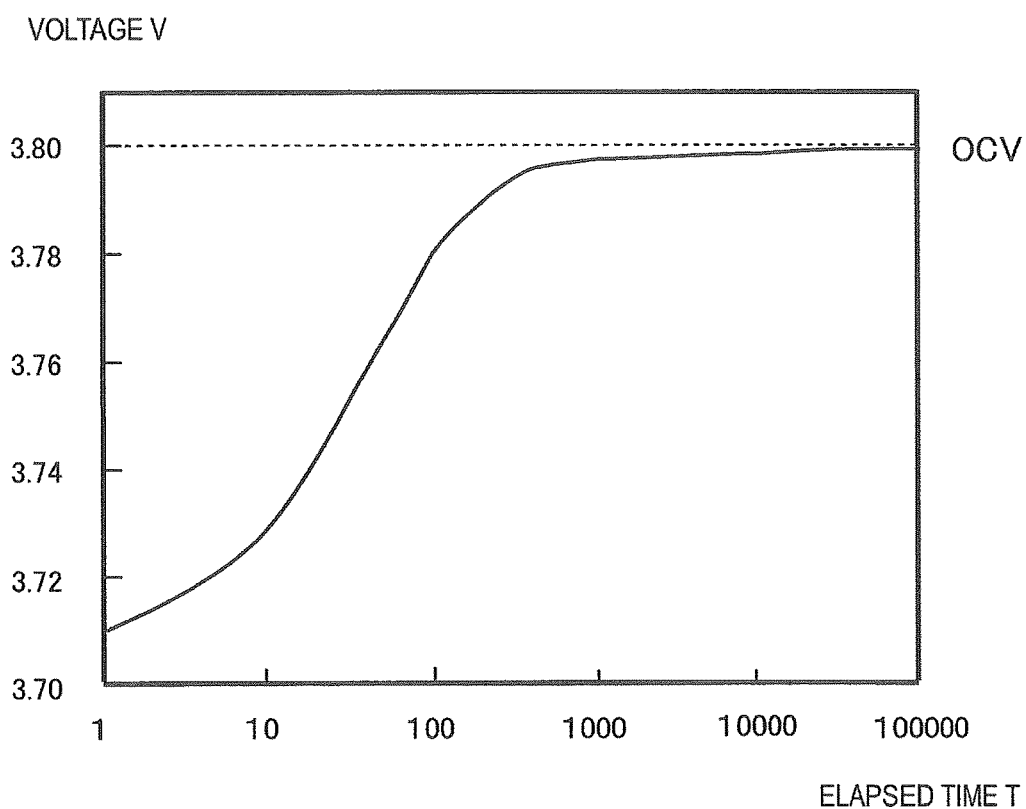
FIG. 6 is a graph illustrating variations in voltage of a cell after discharge is complete.
Figure 7:
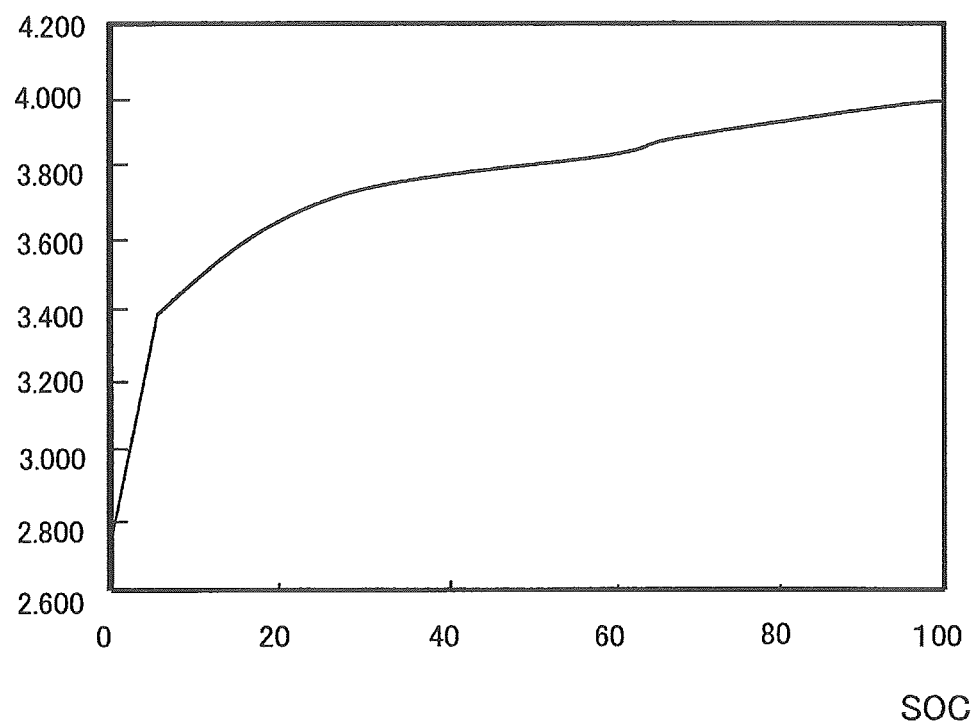
FIG. 7 is a graph illustrating a relationship between SOC and OCV.

Variations in voltage V while the cell 14 is in the non-charge/discharge state are illustrated in FIG. 6. As illustrated in FIG. 6, after the discharge of the cell 14 up to a point when the SOC of the cell 14 reaches a predetermined SOC (50% in FIG. 6), the voltage of the cell 14 increases to the OCV by taking a relatively long period of elapsed time T and converges. As the elapsed time T for measuring the voltage V becomes longer, the OCV can be more accurately estimated based on the voltage V. Therefore, the SOC can be accurately estimated based on the estimated OCV. In the correspondence table in FIG. 8, the errors ΔC in the SOC estimation are set smaller as the elapsed time T for measuring the voltage V becomes longer.

According to the correspondence table, the CPU 70 sets the reference time KT to T1 if the total error ΔCS is equal to 4% or larger (S30). If the total error ΔCS is equal to or larger than 3% and smaller than 4%, the CPU 70 sets the reference time KT to T2 (>T1) (S32). If the total error ΔCS is smaller than 3%, the CPU 70 sets the reference time KT to T3 (>T2) (S34).

The CPU 70 compares the elapsed time T with the reference time KT (S36). If the elapsed time T is shorter than the reference time KT (NO in step S36), the CPU 70 determines whether the status of the cell 14 is a charge/ discharge status (S38). If the cell 14 remains in the non-charge/discharge state (NO in step S38), the CPU 70 returns to step S36.

If the elapsed time T is equal to or longer than the reference time KT (YES in step S36), the CPU 70 estimates the OCV by a known method based on the voltage V measured until the elapsed time T becomes equal to or longer than the reference time KT (S40). The CPU 70 selects the SOC corresponding to the estimated OCV from the second graph stored in the memory 76 and estimates the selected SOC as an SOC3 of the cell 14 that is in the non-charge/discharge state (S42). The SOC3 is another example of the first stage of charge.

The CPU 70 estimates the error ΔC corresponding to the reference time KT in the correspondence table as an error ΔC3 of the cell 14 that is in the non-charge/discharge state (S42). As illustrated in FIG. 8, if the correspondence table is set as a range of the error ΔC, the lowest error may be estimated as the error ΔC3. After the SOC3 and ΔC3 are estimated, the CPU 70 resets the accumulated current IN and the absolute accumulated value IZ (S44), and stores the estimated SOC3 and the estimated error ΔC3 in the memory 76 (S46). The error ΔC3 is another example of the first estimation error.

The CPU 70 updates the reference time KT, that is, set the reference time KT to a longer time than the currently set time (S48). If the reference time KT is set to T1, the CPU 70 updates the reference time KT to T2 (S50) and returns to step S36. If the reference time KT is set to T2, the CPU 70 updates the reference time KT to T3 (S52), and returns to step S36.

In the series of steps from step S36, if the elapsed time T is equal to or longer than the reference time KT (YES in step S36), the CPU 70 estimates the SOC3 and the error ΔC3 again and overwrites the stored SOC3 and error ΔC3 with the newly estimated SOC3 and error ΔC3 in the memory 76 (S46). The CPU 70 repeats the update of the reference time KT while the non-charge/discharge state of the cell 14 is maintained and the estimation of the SOC3 and the error ΔC3.

If the reference time KT is set to T3, the reference time KT cannot be set to the time longer than the currently set time. In this case, the CPU 70 halts the estimation of the SOC3 and the error ΔC3, and terminates the measurement of the temperature D and the voltage V of the cell 14 and the measurement of the current I of the assembled battery 12 (S54). The CPU 70 terminates the SOC estimation process by deactivating the BM 62 and the CS 20 and entering into a sleep state (S56).

If the elapsed time T is shorter than the reference time KT (NO in step 36) and the cell 14 enters the charge/discharge state (YES in step S38), that is, the current I is not zero, the CPU 70 executes the estimation by the current accumulation method (S6 to S14).

3. Effects (1) In the battery pack 60 according to this embodiment, the SOC is estimated based on the total error ΔCS in the estimation by the OCV method executed when the cell 14 is in the non-charge/discharge state.

In the estimation by the OCV method, the SOC is calculated based on the OCV of the cell 14 and thus the estimated error ΔC takes a value affected by the present condition of the cell 14. In the estimation by the current accumulation method, the error ΔC is estimated based on the measurement error of the current sensor 64 and thus the estimated error ΔC takes a value relative to a theoretical error ΔC of the cell 14 indicating an increase/decrease in the theoretical error ΔC. The error ΔC at the time when the charge/discharge of the cell 14 is complete and the cell 14 enters the charge/discharge state is equal to the total error ΔCS. The total error ΔCS is calculated by adding the error ΔC estimated when the cell 14 is in the charge/discharge state and the error ΔC estimated when the cell 14 is in the non-charge/discharge state before when the cell 14 is in the charge/discharge state.

Namely, in the estimation by the OCV method executed when the cell 14 is in the non-charge/discharge state in this battery pack 60, the SOC is estimated based on the total error ΔCS, which corresponds to the error ΔC at the time when the state of the cell 14 is switched to the non-charge/discharge state. If the error ΔC in the SOC estimation by the OCV method is equal to or smaller than the total error ΔCS, the SOC including an error ΔC larger than the total error ΔCS is less likely to be estimated and thus the SOC can be accurately estimated.

(2) Specifically, in the estimation by the OCV method, the reference time KT used for the estimation of SOC is set based on the total error ΔCS. When the elapsed time T since the end of the charge/discharge becomes equal to or longer than the reference time KT, the SOC is estimated. When the elapsed time since the end of the charge/discharge becomes equal to or longer than the reference time KT, the error ΔC in the SOC estimation is smaller than the total error ΔCS. Therefore, the SOC is more accurately estimated in comparison to the SOC estimated in the charge/discharge state.

(3) In the battery pack 60, if the elapsed time T exceeds the reference time KT set based on the total error ΔCS, the reference time KT is updated so that the reference time KT is longer than the currently set time and the SOC is estimated again. Therefore, if the elapsed time T is equal to or longer than the updated reference time KT, the SOC is more accurately estimated in comparison to the SOC estimated based on the total error ΔCS.

(4) In the battery pack 60, as long as the non-charge/discharge state is maintained, the update of the reference time KT and the estimation of SOC are repeated. In the SOC estimation while the non-charge/discharge state is maintained, the accuracy can be improved.

Second Embodiment

A second embodiment will be described with reference to FIGS. 9 and 10. In a battery pack 60 according to this embodiment, a target error ΔCM is predefined. The target error ΔCM is a target value of error at the time when the state of the cell 14 is switched from the non-charge/discharge state to the charge/discharge state. The configuration of the battery pack 60 according to this embodiment is different from that of the battery pack 60 according to the first embodiment in the above point. The same configuration as the first embodiment will not be described.

1. SOC Estimation Process

Figure 9:
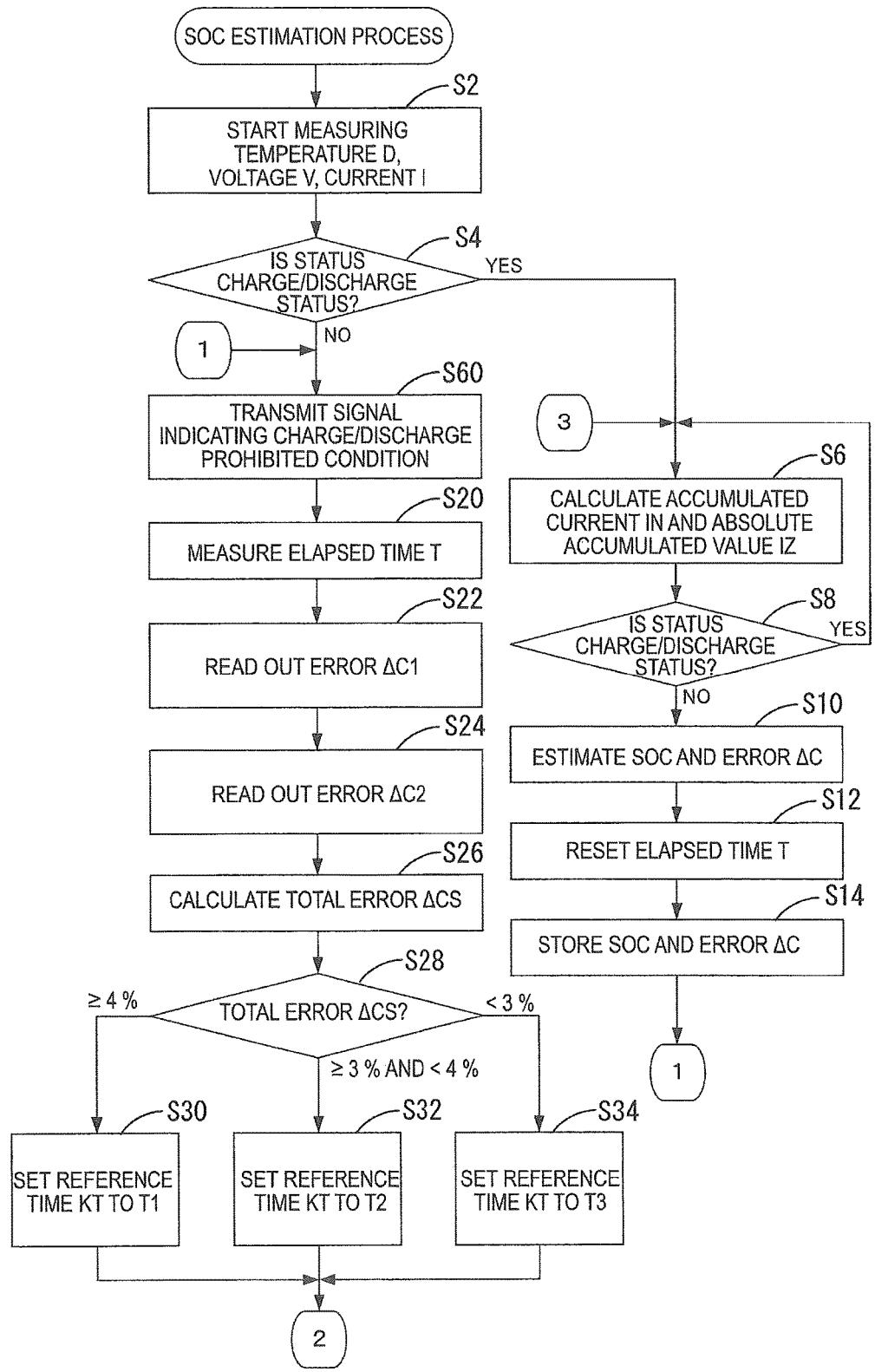
FIG. 9 is a part a flowchart illustrating an SOC estimation process according to an embodiment.

In an SOC estimation process according to this embodiment, as illustrated in FIG. 9, the CPU 70 transmits a signal indicating a charge/discharge prohibited condition in which shifting to the charge/discharge state is prohibited to the BM 62 through the communication unit 28 (S60) in advance to the start of the measurement of the elapsed time T (S20) if the non-charge/discharge state is detected. When the BM 62 receives the signal indicating the charge/discharge prohibited condition, the BM 62 controls the battery module 10 so that the cell 14 does not enter the charge/discharge state even if the electric vehicle is operated by a user, for example, the electric vehicle is powered on or the charge of the electric vehicle is started.

Figure 10:
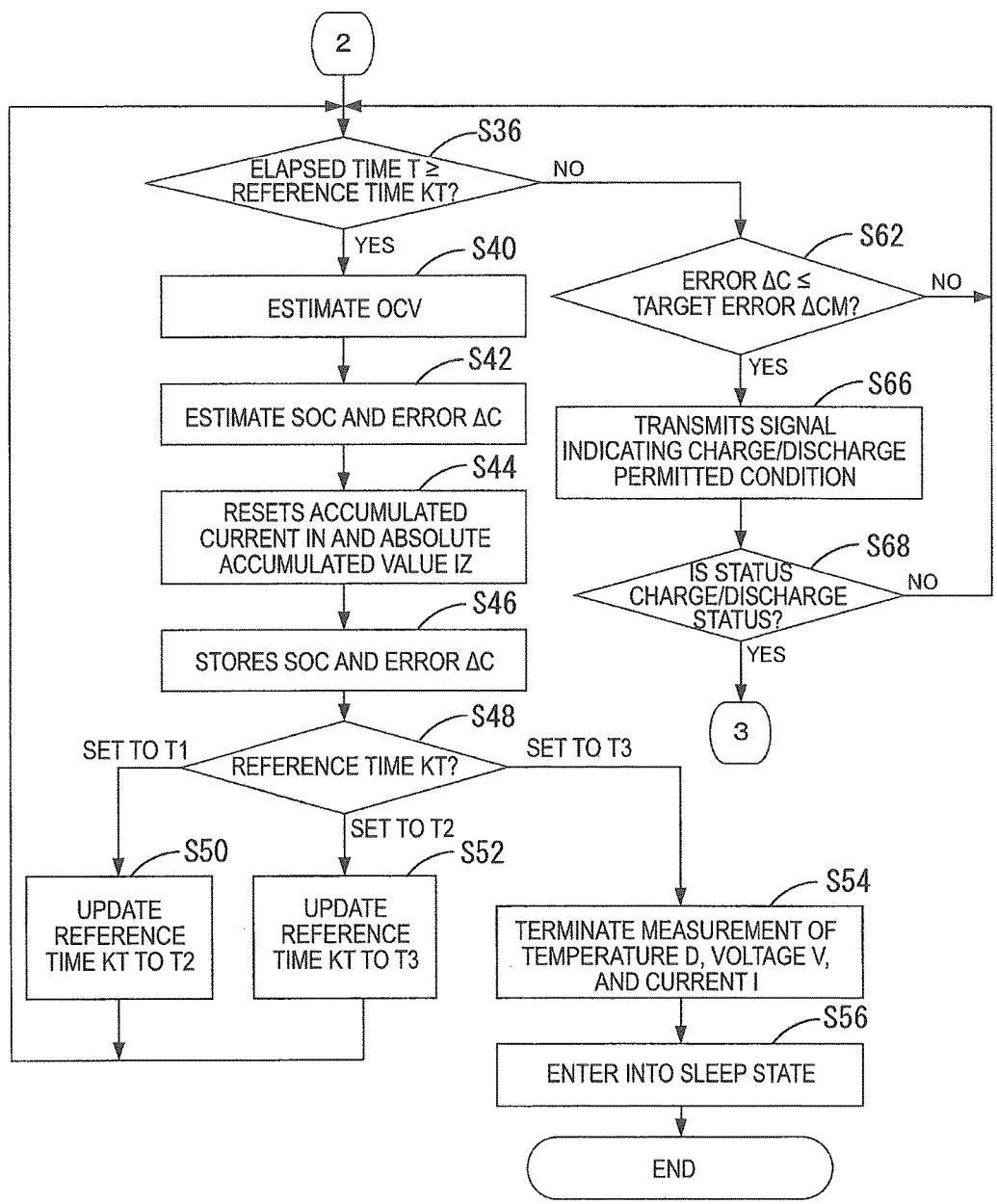
FIG. 10 is a part of the flowchart illustrating the SOC estimation process according to the embodiment.

As illustrated in FIG. 10, the CPU 70 determines whether the elapsed time T is equal to or longer than the reference time KT (S36). If the elapsed time T is shorter than the reference time KT (NO in step S36), the CPU 70 determines whether each of the errors (ΔC2, ΔC3) estimated up to this point with the target error ΔCM (S62). If the error ΔC estimated up to this point is larger than the target error ΔCM (NO in step S62), the CPU 70 maintains the charge/discharge prohibited condition and returns to step S36.

If the error ΔC estimated up to this point is equal to or smaller than the target. error ΔCM (YES in step S62), the CPU 70 transmits a signal indicating a charge/discharge permitted condition in which shifting to the charge/discharge state is permitted to the BM 62 (S66). When the BM 62 receives the signal indicating the charge/discharge permitted condition, the BM 62 controls the battery module 10 so that the cell 14 enters the charge/discharge state if the electric vehicle is operated by a user.

When the cell 14 is in the charge/discharge permitted condition, the CPU 70 dete mines whether a status of the cell 14 is a charge/discharge status (S68). If the cell 14 is maintained in the charge/discharge permitted condition (NO in step S68), that is the current I is zero, the CPU 70 returns to step S36. If the state of the cell 14 is switched to the charge/discharge state (YES in step S68), the CPU 70 executes the estimation by the current accumulation method (steps S6 to S14).

2. Effects

In the SOC estimation process according to this embodiment, when the cell 14 is in the non-charge/discharge state, the charge/discharge prohibited condition is maintained until the estimated error ΔC becomes equal to or smaller than the target error ΔCM so that the cell 14 does not enter the charge/discharge state. When the cell 14 is in the charge/discharge permitted condition and the state thereof is shifted to the charge/discharge state, the error ΔC in the SOC estimation is smaller than the target error ΔCM. Therefore, the SOC can be accurately estimated.

Third Embodiment

A third embodiment will be described with reference to FIGS. 8, 11 and 12. The correlation table illustrated in FIG. 8 contains data on relationship between elapsed time T since the end of charge/discharge of each cell 14 and error ΔC, and relationship between the error ΔC of the cell 14 and time variation DV in voltage V.

As illustrated in FIG. 6, after the discharge of the cell 14 up to a point when the SOC of the cell 14 reaches a predetermined SOC, the voltage V of the cell 14 increases to the OCV by taking a relatively long period of elapsed time T and converges. While the voltage V increases to the OCV, the time variation DV in voltage V continues approximately decreasing. As an absolute value of time variation DV is smaller, the OCV can be more accurately estimated based on the voltage V. Therefore, the SOC can be accurately estimated based on the estimated OCV. In the correspondence table in FIG. 8, the errors ΔC in the SOC estimation are set smaller as the time variation DV becomes longer.

In a battery pack 60 according to this embodiment, a tolerance KV is set. The tolerance KV is used for comparison with a time variation DV. The tolerance KV is set instead of setting the reference time KT used for the comparison with the elapsed time T corresponding to the total error ΔCS in the batter pack 60 according to the first embodiment. The same configuration as the first embodiment will not be described.

1. SOC Estimation Process

Figure 11:
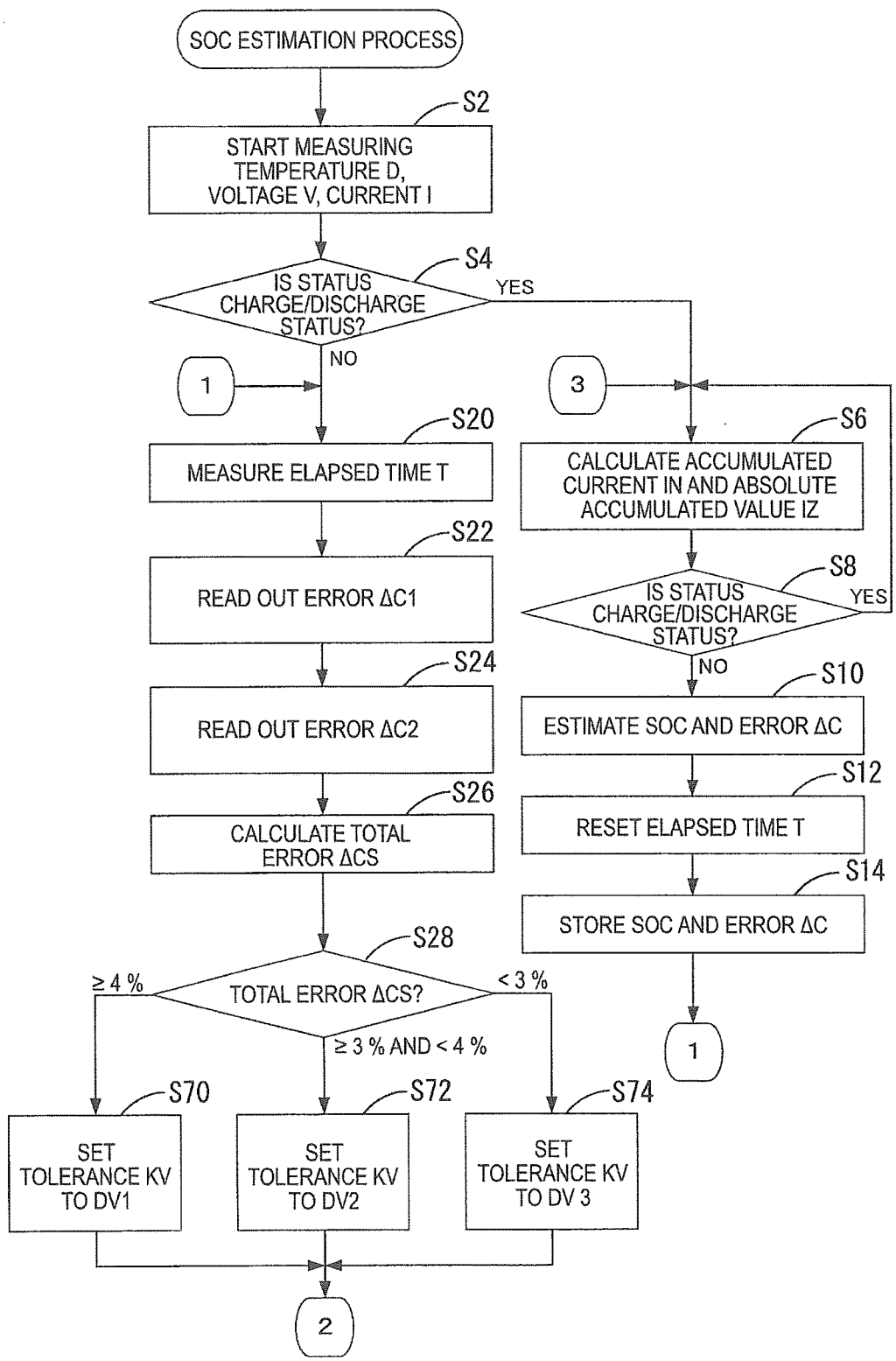
FIG. 11 is a part of a flowchart illustrating an SOC estimation process according to an embodiment.
Figure 12:
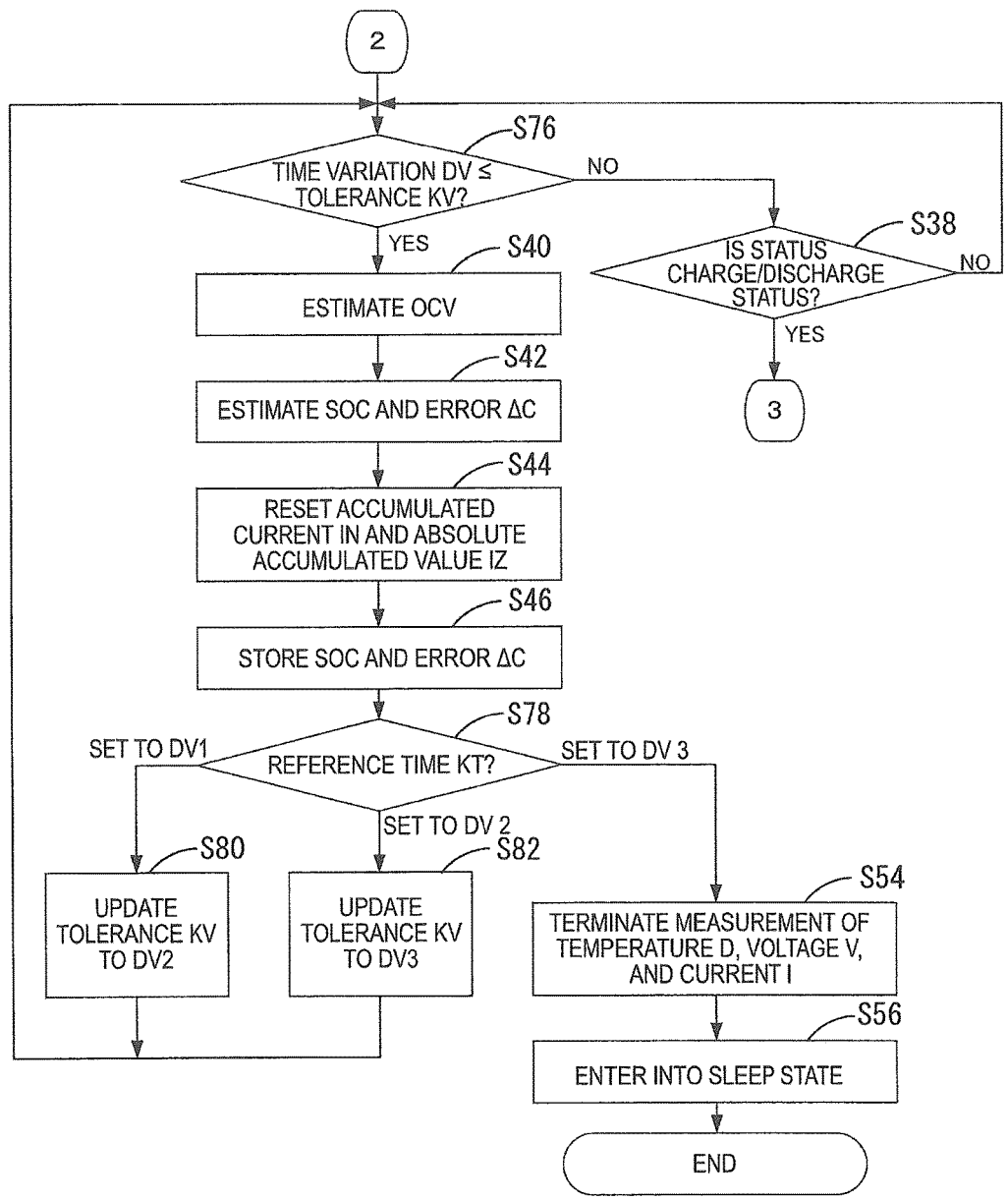
FIG. 12 is a part of the flowchart illustrating the SOC estimation process according the embodiment.

In an SOC estimation process according to this embodiment, as illustrated in FIG. 11, the CPU 70 calculates a total error ΔCS (S26), selects the time variation DV corresponding to the calculated total error ΔCS from the correlation table stored in the memory 76, and set the time variation DV as a tolerance KV (S28).

The CPU 70 refers to the correlation table. If the total error ΔCS is equal to or larger than 4%, the CPU 70 sets the tolerance KV to DV1 (S70). If the total error ΔCS is equal to or larger than 3% and smaller than 4%, the CPU 70 sets the tolerance KV to DV2 (<DV1) (S72). If the total error ΔCS is smaller than 3%, the CPU 70 sets the tolerance KV to DV3 (<DV2) (S74).

The CPU 70 compares the time variation DV with the tolerance KV (S76). If the time variation DV is larger than the tolerance KV (NO in step S76), the CPU 70 determines whether the status of the cell 14 is the charge/discharge status (S38) again. If the time variation DV is equal to or smaller than the tolerance KV (YES in step S76), the CPU 70 estimates the OCV by a known method based on the voltages V measured up to the point when the time variation DV becomes equal to or smaller than the tolerance KV (S40).

The CPU 70 updates the tolerance KV, that is, sets the tolerance KV to a value smaller than the current value (S78). If the tolerance KV is set to DV1, the CPU 70 alters the tolerance KV to DV2 (S80) and returns to step S76. If the tolerance KV is set to DV2, the CPU 70 alters the tolerance KV to DV3 (S82) and returns to step S76.

2. Effects (1) In the battery pack 60 according to this embodiment, the tolerance KV used for the SOC estimation by the OCV method is set based on the total error ΔCS. If the time variation DV in voltage V becomes equal to or smaller than the tolerance KV, the SOC is estimated. When the time variation DV in voltage V becomes equal to or smaller than the tolerance KV, the error ΔC in the SOC estimation is smaller than the total error ΔCS. Therefore, the SOC can be more accurately estimated than the SOC estimated when the cell 14 is in the charge/discharge state.

(2) In the battery pack 60 according to this embodiment, if the time variation DV becomes smaller than the tolerance KV that is set based on the total error ΔCS, the tolerance is updated, that is, set to a value smaller than the current value and the SOC is estimated again. With this configuration, when the time variation DV becomes equal to or smaller than the tolerance KV, the SOC can be more accurately estimated than the SOC estimated based on the total error ΔCS.

Other Embodiments

The technologies described herein are not limited to the embodiments described above and illustrated in the drawings. The following various embodiments are also included in the technical scope of the present invention.

(1) In the above embodiments, the cells 14 that are secondary batteries are used as an example of the electric storage device. However, the technical scope may be applied to capacitors that exhibit electrochemical phenomenon.

(2) In the above embodiments, the total error ΔCS is calculated by adding the error ΔC 1 and the error ΔC2. However, the technical scope is not limited to such a method. For example, the square root of the sum of squares of error ΔC1 and the error ΔC2 may be defined as the total error ΔCS.

(3) In the above embodiments, the reference time KT is updated when the cell 14 is in the non-charge/discharge state. However, the update of the reference time KT is not mandatory. The SOC may be estimated based on the reference KT that is set based on the total error ΔCS when the cell 14 is in the non-charge/discharge state.

(4) Even in the configuration in which the update of the reference time KT is performed, the number of times of updates may be limited.

(5) In the above embodiments, the CPU 70, which is a single CPU included in the BM 62, is used as an example of a controller component. However, the controller component may be configured to include multiple CPUs or a hardware circuit such as an application specific integrated circuit (ASIC). The controller component may be configured to include both hardware circuit and CPU. Namely, the controller component can have any configuration as long as the controller component executes the SOC estimation process through software processing or using a hardware circuit.

(6) In the above embodiments, the programs stored in the memory 76 are used as an example of programs executed by the CPU 70. However, the technical scope may be applied to programs stored on a hard disk drive, a non-volatile memory such as flash memory, a storage medium such as a CD-R. The memory 76 may not be included in the CPU 70. The memory 76 may be arranged outside the CPU 70.

What is claimed is:

1. A state of charge estimation device for estimating a state of charge of an electric storage device, the state of charge estimation device comprising:
    a memory storing data on a first correlation between an elapsed time since an end of charge/discharge of the electric storage device and an estimation error in estimation of the state of charge; and
    a controller component configured to execute a first estimation process and a second estimation process repeatedly,
    the first estimation process being for estimating a first state of charge based on a terminal voltage of the electric storage device when the elapsed time since the end of charge/discharge of the electric storage device reaches a reference time and for determining a first estimation error of the electric storage device in the first state of charge based on the first correlation and the elapsed time,
    the second estimation process being for estimating a second state of charge based on an accumulated charge/discharge current of the electric storage device in a charge/discharge state and for determining a second estimation error of the electric storage device in the second state of charge,
    wherein the controller component is configured to:
        calculate a total error from the first estimation error obtained in a previous execution of the first estimation process and the second estimation error obtained in a previous execution of the second estimation process; and
        shorten the reference time in the first estimation process that is to be 1 executed next as the total error is greater.

2. The state of charge estimation device according to claim 1, wherein the controller component is further configured to:
    update the reference time to a time longer than a present reference time in the first estimation process when the elapsed time becomes equal to or longer than the reference time after executing the first estimation process.

3. The state of charge estimation device according to claim 2, wherein the controller component is further configured to repeatedly execute the update of the reference time and the determining of the first estimation error in the first estimation process until the electric storage device is in the charge/discharge state and the second estimation process is started.

4. The state of charge estimation device according to claim 3, wherein the controller component is further configured to calculate the total error by adding the first estimation error in the first estimation process and the second estimation error in the second estimation process.

5. The state of charge estimation device according to claim 4, wherein the memory further stores data on a second correlation between estimation error in the estimation of state of charge and time variation in the terminal voltage, and
    wherein the controller component is further configured to:
        estimate a time variation in the terminal voltage based on the terminal voltage and the elapsed time;
        estimate that the elapsed time becomes equal to or longer than the reference time when the estimated time variation in the terminal voltage becomes equal to or smaller than a tolerance defined based on the total error and the second correlation;
        update the tolerance to a smaller value when the time variation in the terminal voltage becomes equal to or smaller than the tolerance;
        estimate the first estimation error when the time variation in the terminal voltage reaches the updated tolerance; and
        update the first estimation error with the newly estimated first estimation error.

6. The state of charge estimation device according to claim 3, wherein the memory further stores data on a second correlation between estimation error in the estimation of state of charge and time variation in the terminal voltage, and
    wherein the controller component is further configured to:
        estimate a time variation in the terminal voltage based on the terminal voltage and the elapsed time;
        estimate that the elapsed time becomes equal to or longer than the reference time when the estimated time variation in the terminal voltage becomes equal to or smaller than a tolerance defined based on the total error and the second correlation;
        update the tolerance to a smaller value when the time variation in the terminal voltage becomes equal to or smaller than the tolerance;
        estimate the first estimation error when the time variation in the terminal voltage reaches the updated tolerance; and
        update the first estimation error with the newly estimated first estimation error.

7. The state of charge estimation device according to claim 2, wherein the controller component is further configured to calculate the total error by adding the first estimation error in the first estimation process and the second estimation error in the second estimation process.

8. The state of charge estimation device according to claim 7, wherein the memory further stores data on a second correlation between estimation error in the estimation of state of charge and time variation in the terminal voltage, and
    wherein the controller component is further configured to:
        estimate a time variation in the terminal voltage based on the terminal voltage and the elapsed time;

estimate that the elapsed time becomes equal to or longer than the reference time when the estimated time variation in the terminal voltage becomes equal to or smaller than a tolerance defined based on the total error and the second correlation;

update the tolerance to a smaller value when the time variation in the terminal voltage becomes equal to or smaller than the tolerance;

estimate the first estimation error when the time variation in the terminal voltage reaches the updated tolerance; and update the first estimation error with the newly estimated first estimation error.

9. The state of charge estimation device according to claim 2, wherein the memory further stores data on a second correlation between estimation error in the estimation of state of charge and time variation in the terminal voltage, and wherein the controller component is further configured to:
estimate the time variation in the terminal voltage based on the terminal voltage and the elapsed time;
estimate that the elapsed time becomes equal to or longer than the reference time when the estimated time variation in the terminal voltage becomes equal to or smaller than a tolerance defined based on the total error and the second correlation;
update the tolerance to a smaller value when the time variation in the terminal voltage becomes equal to or smaller than the tolerance;
estimate the first estimation error when the time variation in the terminal voltage reaches the updated tolerance; and
update the first estimation error with the newly estimated first estimation error.

10. The state of charge estimation device according to claim 1, wherein the controller component is further configured to calculate the total error by adding the first estimation error in the first estimation process and the second estimation error in the second estimation process.

11. The state of charge estimation device according to claim 10, wherein the memory further stores data on a second correlation between estimation error in the estimation of state of charge and time variation in the terminal voltage, and wherein the controller component is further configured to:
estimate a time variation in the terminal voltage based on the terminal voltage and the elapsed time;
estimate that the elapsed time becomes equal to or longer than the reference time when the estimated time variation in the terminal voltage becomes equal to or smaller than a tolerance defined based on the total error and the second correlation;
update the tolerance to a smaller value when the time variation in the terminal voltage becomes equal to or smaller than the tolerance;
estimate the first estimation error when the time variation in the terminal voltage reaches the updated tolerance; and
update the first estimation error with the newly estimated first estimation error.

12. The state of charge estimation device according to claim 1, wherein the memory further stores data on a second correlation between estimation error in the estimation of state of charge and a time variation in the terminal voltage, and wherein the controller component is further configured to:
estimate the time variation in the terminal voltage based on the terminal voltage and the elapsed time;
estimate that the elapsed time becomes equal to or longer than the reference time when the estimated time variation in the terminal voltage becomes equal to or smaller than a tolerance defined based on the total error and the second correlation;
update the tolerance to a smaller value when the time variation in the terminal voltage becomes equal to or smaller than the tolerance;
estimate the first estimation error when the time variation in the terminal voltage reaches the updated tolerance; and
update the first estimation error with the newly estimated first estimation error.

13. The state of charge estimation device according to claim 1, wherein, based on a result of the execution by the controller component, the electric storage device is charged by a charger or discharged to a device.

14. A method of estimating a state of charge of an electric storage device, the method comprising;
a first estimation of a first state of charge based on a terminal voltage of the electic storage device when an elapsed time since an end of charge/discharge of the electric storage device reaches a reference time and for determining a first estimation error of the electric storage device in the first state of charge based on a first correlation between the elapsed time since the end of charge/discharge of the electric storage device and an estimation error in estimation of the state of charge and the elapsed time; and
a second estimation of a second state of charge based on an accumulated charge/discharge current of the electric storage device in a charge/discharge state and for determining a second estimation error of the electric/ storage device in the second state of charge;
wherein the first estimation process includes:
calculating a total error from the first estimation error obtained in a previous execution of the first estimation process and the second estimation error obtained in a previous execution of the second estimation process; and
shortening the reference time in the first estimation process that is to be executed next as the total error is greater.

15. The method of estimation according to claim 14, wherein, based on a result of the first estimation and the second estimation, the electric storage device is charged by a charger or discharged to a device.

* * * * *